(12) United States Patent
Takeguchi

(10) Patent No.: US 7,227,784 B2
(45) Date of Patent: Jun. 5, 2007

(54) NONVOLATILE SEMICONDUCTOR MEMORY DEVICE PERFORMING ERASE OPERATION THAT CREATES NARROW THRESHOLD DISTRIBUTION

(75) Inventor: Tetsuji Takeguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/358,206

(22) Filed: Feb. 22, 2006

(65) Prior Publication Data

US 2007/0103974 A1 May 10, 2007

(30) Foreign Application Priority Data

Nov. 7, 2005 (JP) ............................. 2005-322480

(51) Int. Cl.
*G11C 16/04* (2006.01)
(52) U.S. Cl. ........................... 365/185.18; 365/185.22; 365/185.29
(58) Field of Classification Search ........... 365/185.18, 365/185.22, 185.29, 185.3
See application file for complete search history.

(56) References Cited

U.S. PATENT DOCUMENTS 6,172,911 B1* 1/2001 Tanaka et al. ......... 365/185.22
6,356,480 B1* 3/2002 Sakakibara et al. .... 365/185.22
6,466,484 B1* 10/2002 Sakakibara et al. .... 365/185.29
7,139,201 B2* 11/2006 Tanaka et al. ......... 365/185.29

FOREIGN PATENT DOCUMENTS

JP 2001-184876 7/2001
JP 2003-162896 6/2003

* cited by examiner

*Primary Examiner*—Gene N. Auduong
(74) *Attorney, Agent, or Firm*—Arent Fox LLP.

(57) ABSTRACT

A nonvolatile semiconductor memory device includes a control circuit configured to perform a first block erase operation that erases nonvolatile memory cells together in a lump such that threshold voltages of the memory cells are set lower than a first erase verify voltage, to check whether a threshold voltage of each of the nonvolatile memory cells is lower than a first erase-degree-check voltage after the first block erase operation, to perform a first write-back operation in response to a check result indicating that the threshold voltage is lower than the first erase-degree-check voltage, thereby raising the threshold voltage above a voltage higher than the first erase-degree-check voltage, and to perform a second block erase operation that erases the nonvolatile memory cells together in a lump after the first write-back operation such that the threshold voltages of the memory cells are set lower than a second erase verify voltage.

10 Claims, 14 Drawing Sheets

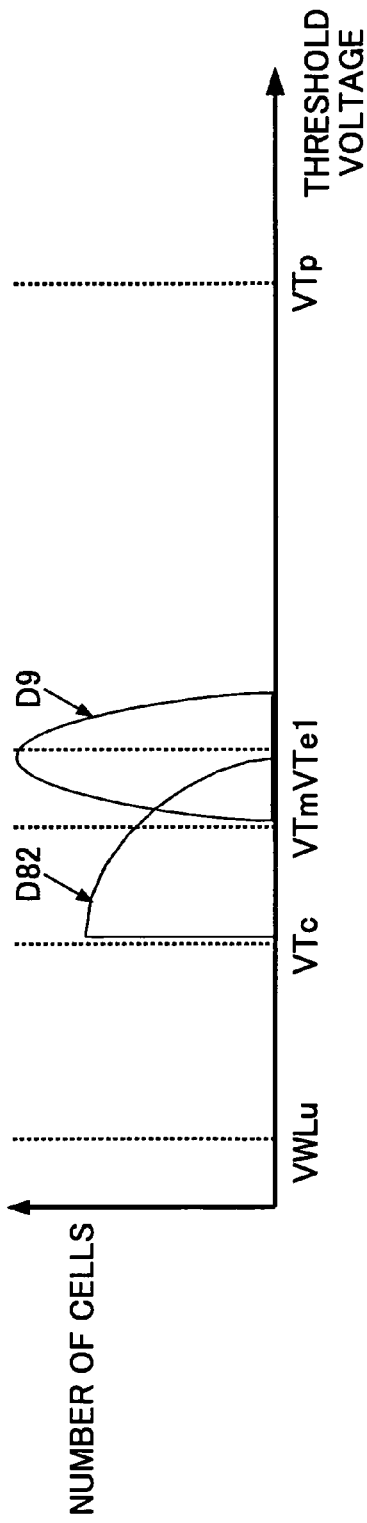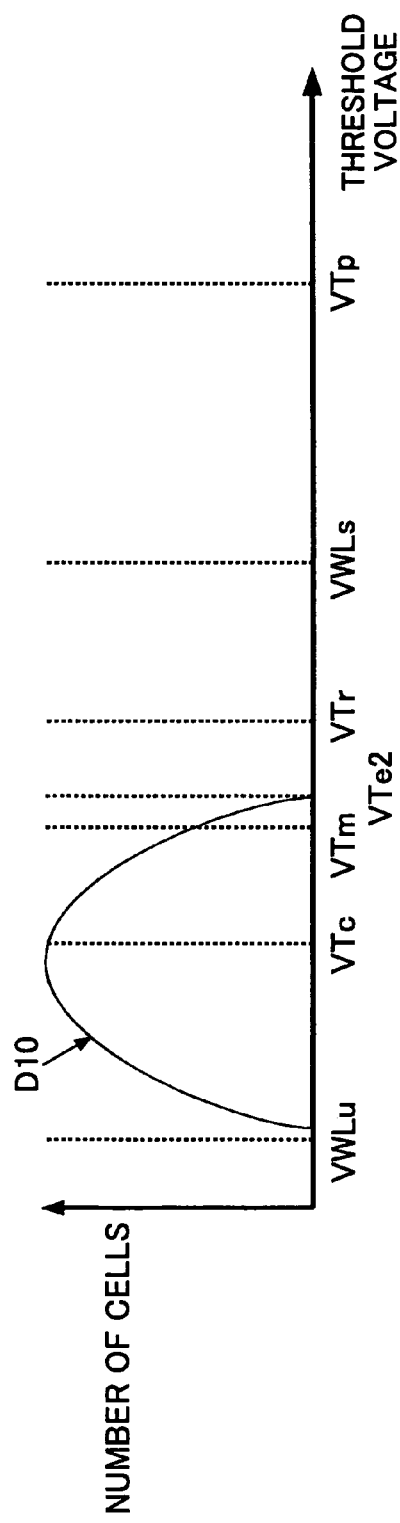

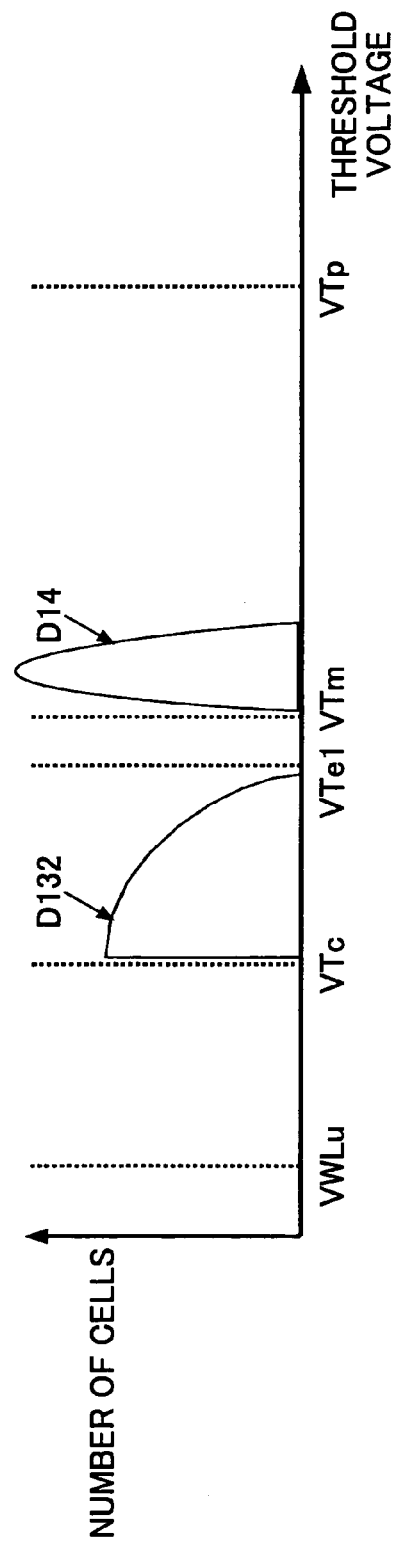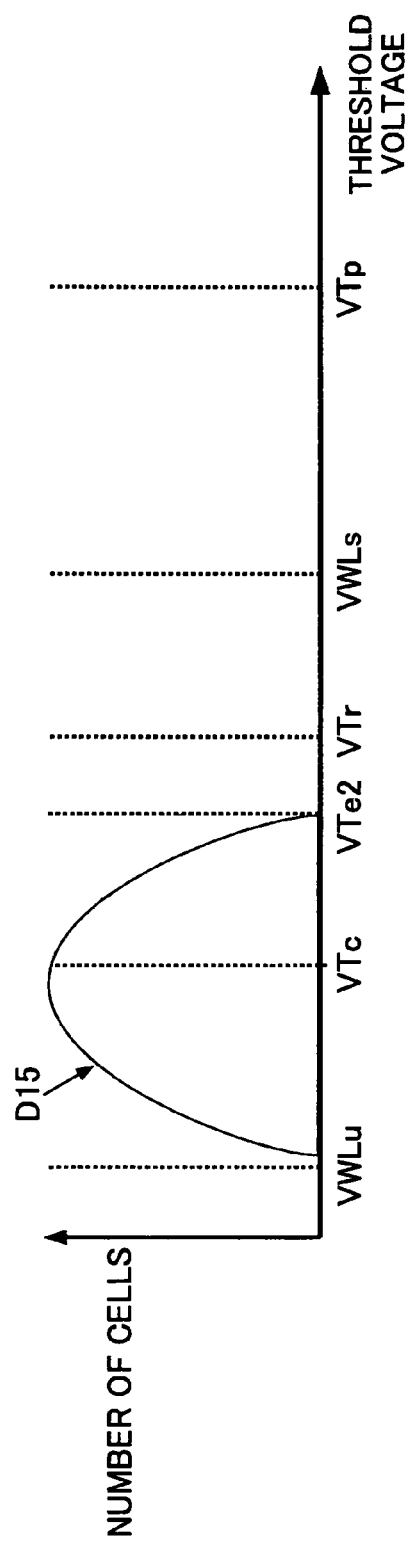

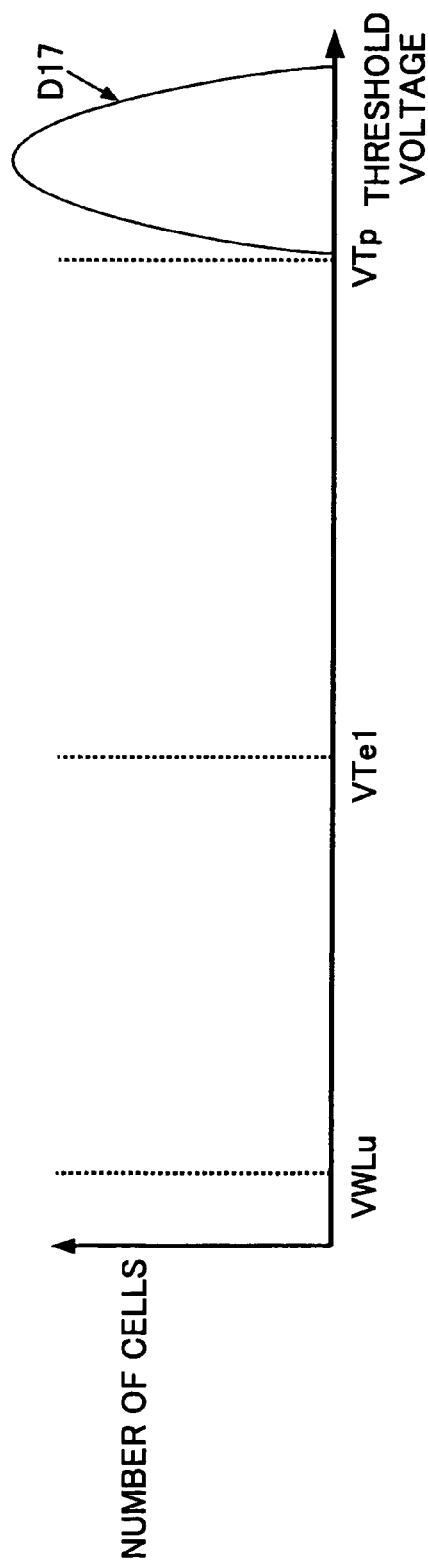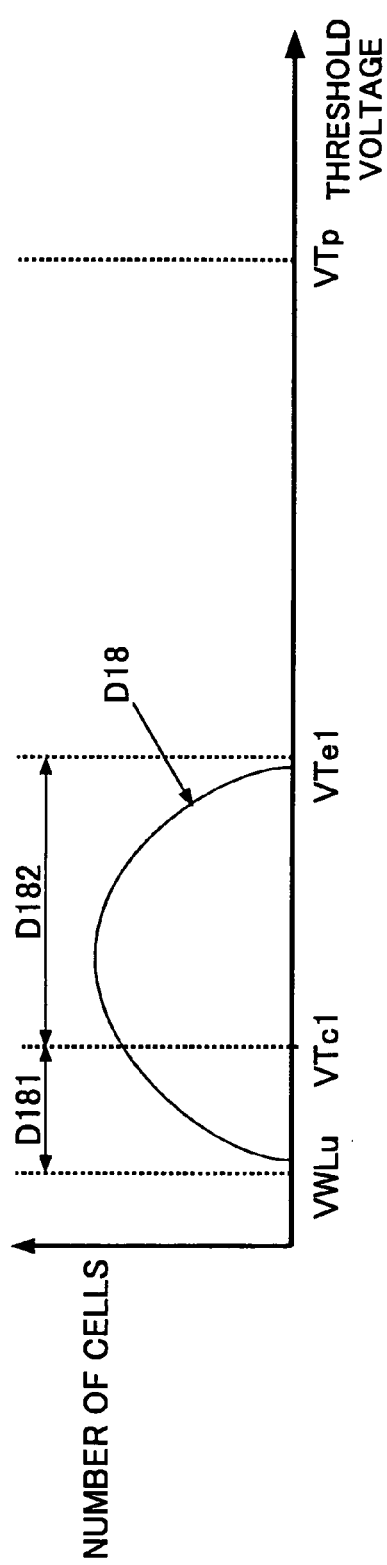

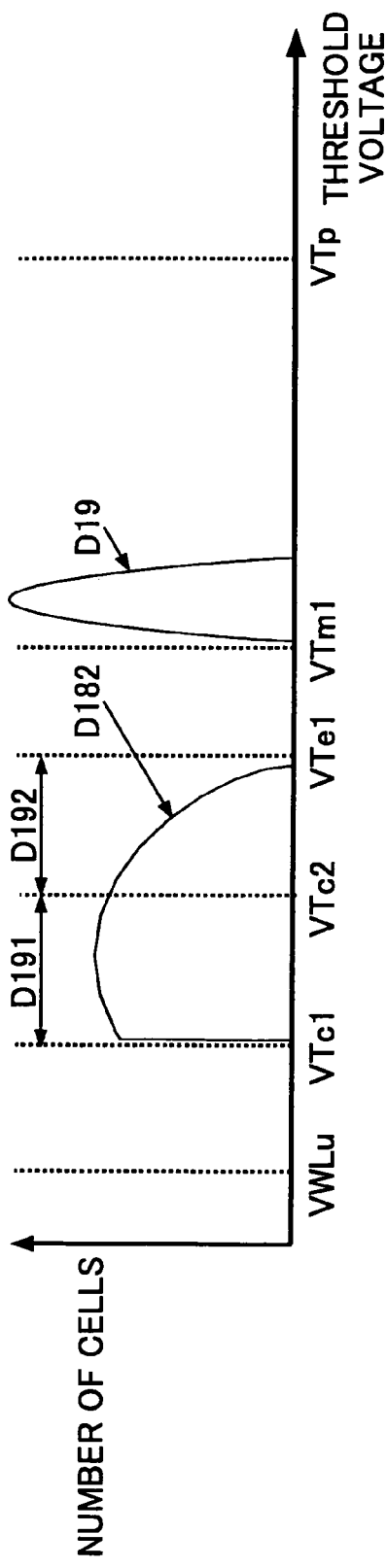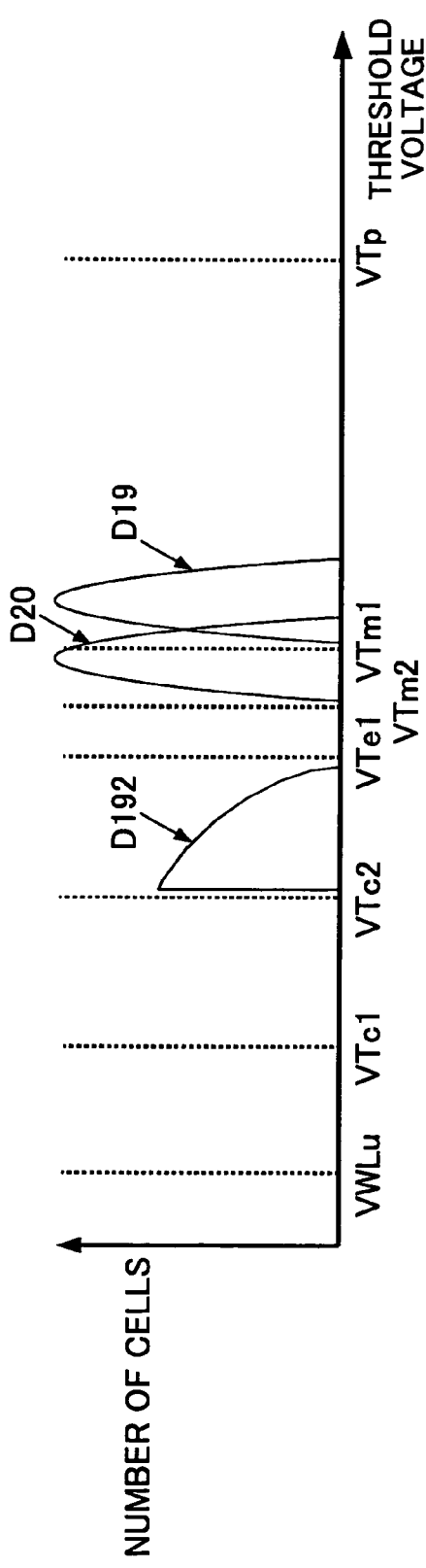

NONVOLATILE SEMICONDUCTOR MEMORY DEVICE PERFORMING ERASE OPERATION THAT CREATES NARROW THRESHOLD DISTRIBUTION

CROSS-REFERENCE TO RELATED APPLICATIONS

The present application is based upon and claims the benefit of priority from the prior Japanese Patent Application No. 2005-322480 filed on Nov. 7, 2005, with the Japanese Patent Office, the entire contents of which are incorporated herein by reference.

BACKGROUND OF THE INVENTION

1. Field of the Invention

The present invention generally relates to semiconductor memory devices and memory erasure methods, and particularly relates to a nonvolatile semiconductor memory device and a method of erasing nonvolatile memory cells.

2. Description of the Related Art

Flash memories are widely used as nonvolatile semiconductor memory devices that allow memory cells to be electrically written and erased. An erase operation in flash memories is performed as a block erase for the entire memory cell array or a block erase on a block-by-block basis. Namely, memory cells are erased together in a lump with respect to the entire memory cell array or with respect to a specific one of the blocks into which the memory cell array is divided.

In the flash memories, electrons are injected into or removed from the floating gate of a memory cell, thereby performing a write operation and an erase operation with respect to the memory cell. As one of the characteristics of the flash memories, the threshold voltage of a memory cell is determined in response to the amount of electrons trapped in the floating gate. By utilizing this, the high-threshold voltage state (written state) in which electrons are trapped in the floating gate is assigned to logic "0", and the low-threshold voltage state (erased state) in which electros have been removed from the floating gate is assigned to logic "1".

In the flash memories, erase speed differs from memory cell to memory cell due to manufacturing variation in the thickness and/or minute defect of the oxide film of the transistor constituting a memory cell. Even when identical erase operations are performed, therefore, a cell that is easy to erase is set to a low threshold voltage, and a cell that is difficult to erase is set to a high threshold voltage. As a result, the threshold voltages of memory cells are not set constant, and end up having a certain distribution that may be defined with respect to the memory cells of a memory cell array.

FIG. 1 through FIG. 3 are drawings for explaining a memory erase operation in a conventional flash memory. In each of the drawings, the horizontal axis represents the threshold voltage of memory cells of a memory cell array, and the vertical axis represents the number of memory cells present in the memory cell array that have a given threshold voltage.

In order to erase the entire memory cell array or the block to be erased (hereinafter referred to as a memory cell array for the sake of convenience), a "preliminary write" operation is performed that places each memory cell of the memory cell array in the written state. To this end, a write verify that compares the current running through a reference cell having threshold voltage VTp as shown in FIG. 1 with the read current of each cell of the memory cell array is performed. A write operation with respect to each memory cell is performed until each memory cell of the memory cell array is placed in the written state by passing the write verify. After the "preliminary write", as shown as a distribution D2 in FIG. 2, the threshold voltages of all the memory cells are set higher than VTp, which corresponds to the logic "0" state.

Thereafter, a block erase is performed with respect to the memory cell array after the "preliminary write". To this end, an erase verify that compares the current running through a reference cell having threshold voltage VTe as shown in FIG. 2 with the read current of each cell of the memory cell array is performed. A block erase operation with respect to the memory cell array is performed until each memory cell of the memory cell array is placed in the erased state by passing the erase verify. As a result, as shown as a distribution D3 in FIG. 3, the threshold voltages of all the memory cells are set lower than VTe, which corresponds to the logic "1" state.

The reason why the preliminary write operation is performed prior to an erase operation will be described in the following. In a memory cell array prior to erasure, memory cells having logic "1" conforming to a distribution D11 and memory cells having logic "0" conforming to a distribution D10 are in existence as shown in FIG. 1. When the memory cells are subjected to a block erase, all the memory cells are erased in the same manner. As a result, the memory cells having logic "1" at the beginning tend to end up having a lower threshold than the memory cells having logic "0" at the beginning. Because of this, the distribution of threshold voltages of all the memory cells ends up being an extremely wide distribution. In order to avoid such an extremely wide threshold voltage distribution, a preliminary write operation is performed prior to an erase operation as described above.

In flash memories, voltage VWLs is applied to the selected word line, and voltage VWLu is applied to the unselected word lines in order to read data from memory cells. Further, voltage VLWs is applied to the word line of the read reference cell. This read reference cell has threshold voltage VTr. The voltage VLWs, voltage VWLu, and threshold voltage VTr are shown in FIG. 1 through FIG. 3.

The current of a memory cell coupled to the selected word line is compared with the current of the reference cell by a sense amplifier. If the current of the memory cell is larger (i.e., if the threshold voltage is lower), logic "1" is detected. If the current of the memory cell is smaller (i.e., if the threshold voltage is higher), logic "0" is detected.

The upper limit of the threshold voltage of a memory cell having logic "1" is controlled by the erase verify reference voltage VTe (i.e., the threshold voltage of the erase-verify-purpose reference cell). In order to properly detect a memory cell having logic "1" as being logic "1", the read reference cell threshold voltage VTr needs to be higher than the erase verify reference voltage VTe by a predetermined voltage $\Delta VT1$. The value of the predetermined voltage $\Delta VT1$ depends on the characteristics of the sense amplifier and required read speed.

Since there is a need to flow a current through the reference cell to be compared at the time of read operation, the selected-word-line voltage VWLs needs to be higher than the read reference cell threshold voltage VTr by a predetermined voltage $\Delta VT0$. The value of the predetermined voltage $\Delta VT0$ depends on the required read speed.

Accordingly, in order to correctly read the values of memory cells having the threshold voltage distributions as shown in FIG. 1, the selected-word-line voltage VWLs needs to be set higher than the erase verify reference voltage VTe by $\Delta VT1+\Delta VT0$. IF VTe=2.5 V, $\Delta VT1$=0.5 V, and $\Delta VT0$=1 V, for example, the selected-word-line voltage VWLs is 4 V. In this case, a 5-V power supply voltage applied to the flash memory can easily generate a proper word line voltage.

In recent years, however, the power supply voltage of flash memories has generally been lowered from 5 V to 3 V and further to 1.8 V. In order to generate a proper selected-word-line voltage VWLs from a low power supply voltage, there is a need to step-up the voltage. Such stepping-up of voltage, however, results in an increase in electric current consumption, which gives rise to a need to suppress the selected-word-line voltage VWLs as low as possible.

In order to lower the selected-word-line voltage VWLs in FIG. 1 through FIG. 3, it suffices to lower the erase verify reference voltage VTe. If the erase verify reference voltage VTe is lowered, however, the threshold voltage distribution D3 after the erase operation ends up being shifted, as a whole, to a lower voltage. In this case, memory cells situated close to the left end of the threshold voltage distribution D3 are undesirably placed in the over-erased state. When a memory celli is in the over-erased state, a current constantly runs through the memory cell even if the unselected-word-line voltage VWLu is applied to the word line. As a result, the current of such unselected memory cell is added to the current of a selected memory cell, making it difficult to perform a proper read operation.

[Patent Document 1] Japanese Patent Application Publication No. 2001-184876

[Patent Document 2] Japanese Patent Application Publication No. 2003-162896

Accordingly, there is a need for a nonvolatile semiconductor memory device and a memory cell erase method that can achieve a threshold voltage distribution after the erase operation that is narrower than conventional distributions.

SUMMARY OF THE INVENTION

It is a general object of the present invention to provide a nonvolatile semiconductor memory device and a memory cell erase method that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device and a memory cell erase method particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device which includes a plurality of nonvolatile memory cells constituting an entirety or part of a memory cell array, and a control circuit configured to perform a first block erase operation that erases the plurality of nonvolatile memory cells together in a lump such that threshold voltages of the memory cells are set lower than a first erase verify voltage, to perform a first erase-degree check as to whether a threshold voltage of each of the nonvolatile memory cells is lower than a first erase-degree-check voltage after the first block erase operation, to perform a first write-back operation in response to a check result indicating that the threshold voltage is lower than the first erase-degree-check voltage, the first write-back operation raising the threshold voltage above a first write-back-verify voltage that is higher than the first erase-degree-check voltage, and to perform a second block erase operation that erases the plurality of nonvolatile memory cells together in a lump after the first write-back operation such that the threshold voltages of the memory cells are set lower than a second erase verify voltage.

Further, according to another aspect of the present invention, a method of erasing nonvolatile memory cells in a nonvolatile semiconductor memory device in which a plurality of nonvolatile memory cells constituting an entirety or part of a memory cell array are erased together in a lump includes a first block erase step of erasing the plurality of nonvolatile memory cells together in a lump, a check step of checking whether a threshold voltage of each of the nonvolatile memory cells is lower than a predetermined voltage after the first block erase step, a write-back step of raising the threshold voltage above the predetermined voltage of the check step with respect to the nonvolatile memory cells having the threshold voltages lower than the predetermined voltage in accordance with a check result of the check step, and a second block erase step of erasing the plurality of nonvolatile memory cells together in a lump after the write-back step.

According to at least one embodiment of the present invention, the first erase operation is performed, and, then, a preparatory operation inclusive of the erase-degree check and the write-back operation is performed, followed by the second erase operation. Through the preparatory operation inclusive of the erase-degree check and the write-back operation, the memory cells that are comparatively easy to erase are given threshold voltages generally higher than those of the memory cells that are comparatively difficult to erase, thereby narrowing the threshold voltage distribution that appears after the second erase operation. Namely, the threshold voltages of the memory cells that are lower than a predetermined threshold voltage in the threshold distribution after the first erase operation are raised, prior to the second erase operation, generally above the threshold voltages of the memory cells that are higher than the predetermined threshold voltage, thereby shifting to the right the position of the left end of the threshold voltage distribution appearing after the second erase operation.

As a result, it becomes easier to generate a proper selected-word-line voltage from a low power supply voltage. Further, even if the boosting of voltage is necessary in order to generate a word line voltage, the rate of voltage boosting (voltage stepping-up) can be kept low, thereby making it possible to suppress current consumption. Moreover, it is possible to prevent the memory cells from being over-erased, which provides for a read operation to be properly performed.

BRIEF DESCRIPTION OF THE DRAWINGS

Other objects and further features of the present invention will be apparent from the following detailed description when read in conjunction with the accompanying drawings, in which:

FIG. 9 is a drawing for explaining the first embodiment of the erase operation according to the present invention;

FIG. 10 is a drawing for explaining the first embodiment of the erase operation according to the present invention;

FIG. 14 is a drawing for explaining the second embodiment of the erase operation according to the present invention;

FIG. 15 is a drawing for explaining the second embodiment of the erase operation according to the present invention;

FIG. 17 is a drawing for explaining the third embodiment of the erase operation according to the present invention;

FIG. 18 is a drawing for explaining the third embodiment of the erase operation according to the present invention;

FIG. 19 is a drawing for explaining the third embodiment of the erase operation according to the present invention;

FIG. 20 is a drawing for explaining the third embodiment of the erase operation according to the present invention;

DESCRIPTION OF THE PREFERRED EMBODIMENTS

In the following, embodiments of the present invention will be described with reference to the accompanying drawings.

Figure 1:
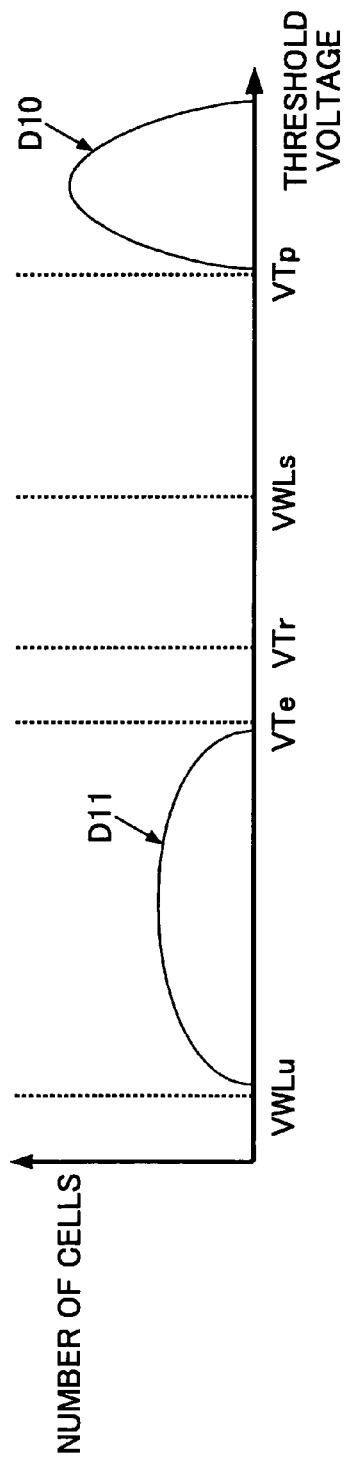
FIG. 1 is a drawing for explaining a memory erase operation in a conventional flash memory.
Figure 4:
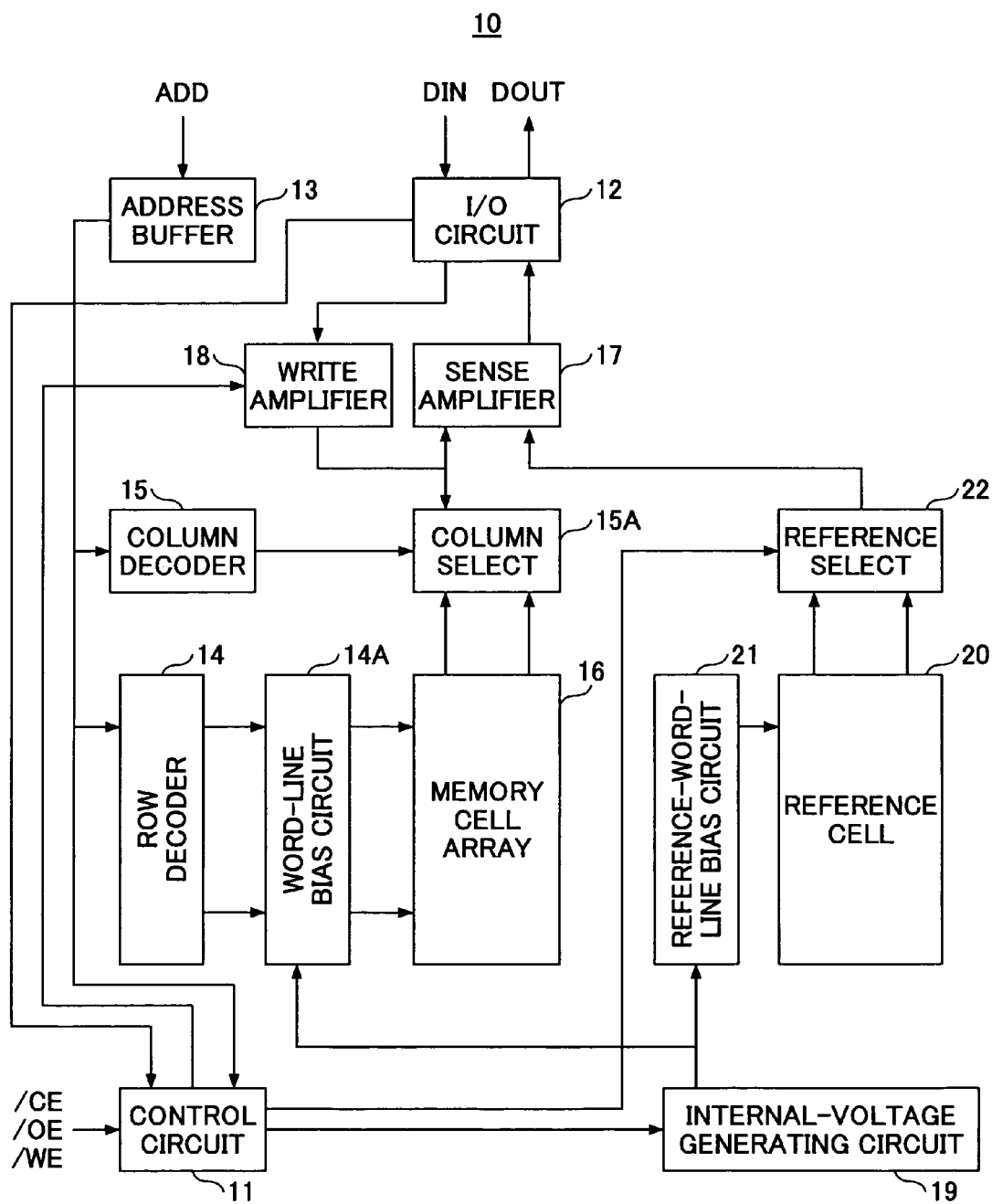
FIG. 4 is a block diagram showing an example of the configuration of a nonvolatile semiconductor memory device to which the present invention is applied.

FIG. 4 is a block diagram showing an example of the configuration of a nonvolatile semiconductor memory device to which the present invention is applied. A nonvolatile semiconductor memory device 10 of FIG. 1 includes a control circuit 11, an I/O circuit (input/output circuit) 12, an address buffer 13, a row decoder 14, a word-line bias circuit 14A, a column decoder 15, a column select 15A, a memory cell array 16, a sense amplifier 17, a write amplifier 18, an internal-voltage generating circuit 19, a reference cell 20, a reference-word-line bias circuit 21, and a reference select 22.

The control circuit 11 receives control signals such as a chip-enable signal /CE, an output-enable signal /OE, and a write-enable signal /WE from the exterior of the device. The control circuit 11 operates as a state machine based on these control signals, thereby controlling the operation of each part of the nonvolatile semiconductor memory device 10.

The I/O circuit 12 receives data from the exterior of the device, and supplies the received data to the write amplifier 18. The address buffer 13 latches address signals supplied from the exterior of the device, and supplies these address signals to the control circuit 11, the row decoder 14, and the column decoder 15. The row decoder 14 decodes the address supplied from the address buffer 13, and supplies the decoded result to the word-line bias circuit 14A. The word-line bias circuit 14A selectively activates a word line provided in the memory cell array 16 in response to the decoded result supplied from the row decoder 14. The column decoder 15 decodes the address supplied from the address buffer 13, and selectively opens/closes the column select 15A in response to the decoded address signal. With this arrangement, the column select 15A selectively couples bit lines of the memory cell array 16 to the sense amplifier 17.

The memory cell array 16 includes an array of memory cell transistors, word lines, bit lines, etc., and stores data in each memory cell transistor. At the time of a data read, data are read from memory cells selected by the activated word line, and are supplied to the bit lines. At the time of a write or erase, the word lines and bit lines are set to potentials suitable for respective operations, thereby injecting or removing electric charge into or from memory cells. The memory cell array 16 may be comprised of a plurality of blocks each including a memory cell array, and an erase operation may be performed on a block-by-block basis.

Figure 5:
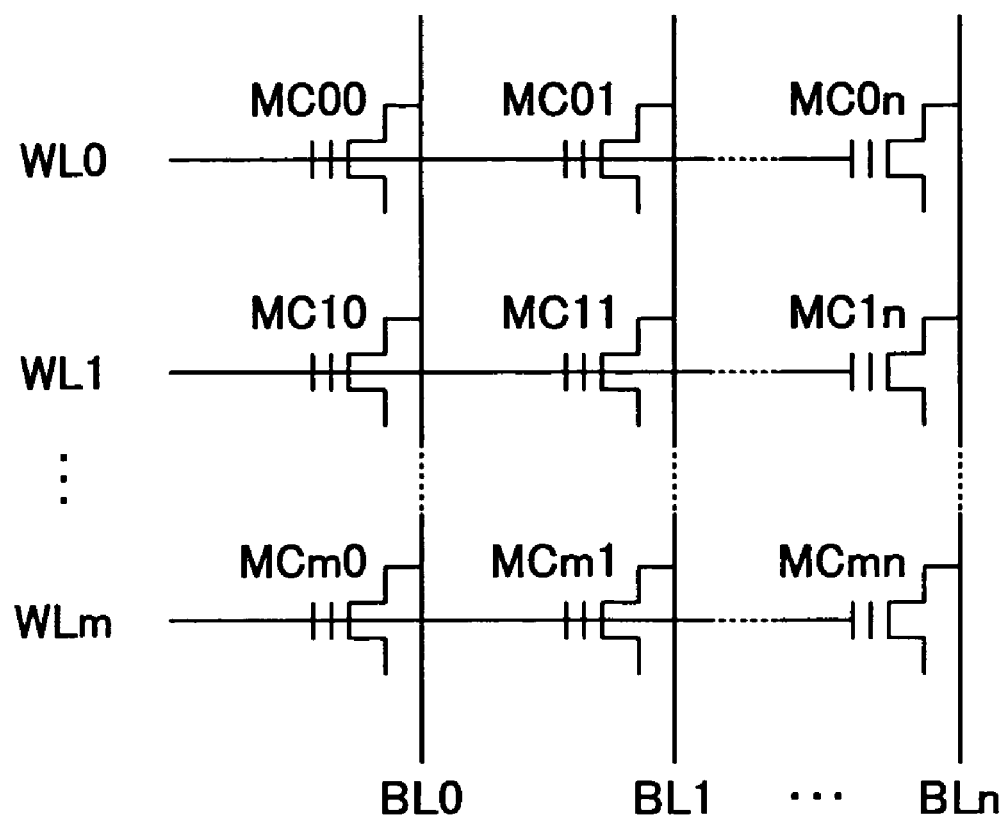
FIG. 5 is a drawing showing an example of the configuration of a memory cell array.

FIG. 5 is a drawing showing an example of the configuration of the memory cell array 16. The memory cell array 16 shown in FIG. 5 includes memory cells MC00 through MCmn arranged in m rows and n columns, word lines WL0 through WLm, and bit lines BL0 through BLn. The memory cells MCx0 through MCxn belonging to the same row (the x-th row in this example) have the gates thereof connected to the same word line WLx. The memory cells MC0y through MCmy belonging to the same column (the y-th column in this example) have the drain nodes thereof connected to the same bit line BLy.

The row decoder 14 shown in FIG. 4 selects a row in the memory cell array 16, so that the word-line bias circuit 14A selectively activates the word line corresponding to the selected row. Further, the column decoder 15 shown in FIG. 4 specifies a column in the memory cell array 16, so that the bit line corresponding to the specified column is coupled to the sense amplifier 17 via the column select 15A.

Turning to FIG. 4 again, the sense amplifier 17 compares a reference current with a data current that is supplied from the memory cell array 16 according to selection by the row decoder 14 and the column decoder 15. This achieves the sensing of data as to whether the data is 0 or 1. The sensed data is supplied as read data to the I/O circuit 12.

A verify operation for write operation or erase operation is performed by comparing the reference current of a write-verify-purpose reference cell or an erase-verify-purpose reference cell with a data current that is supplied from the memory cell array 16 according to selection by the row decoder 14 and the column decoder 15. In write operation, write data is stored in the data latch of the write amplifier 18. The word lines and bit lines of the memory cell array 16 are set to relevant potentials based on this data, thereby injecting electric charge into memory cells.

The reference current is supplied from the reference cell 20 to the sense amplifier 17 via the reference select 22. The reference cell 20 includes a plurality of reference cells such as a read-check-purpose reference cell, a write-verify-purpose reference cell, and an erase-verify-purpose reference cell. The reference-word-line bias circuit 21 operates under the control of the control circuit 11 to apply, to the word line of the reference cells of the reference cell 20, the voltage supplied from the internal-voltage generating circuit 19. Further, the reference select 22 operates under the control of the control circuit 11 to select a desired reference cell, thereby coupling the selected reference cell to the sense amplifier 17. In the embodiment of the present invention, the reference cell 20 further includes a erase-degree-check-purpose reference cell, a write-back-verify-purpose reference cell, and a second erase-verify-purpose reference cell.

The internal-voltage generating circuit 19 operates under the control of the control circuit 11 to generate a write-purpose high voltage, an erase-purpose negative voltage, a word-line potential, etc. The write-purpose high voltage is supplied to the memory cell array 16 via the word-line bias circuit 14A and the like, so that a data write operation is performed based on the write data stored in the write amplifier 18. The erase-purpose negative voltage is supplied to the memory cell array 16 via the word-line bias circuit 14A and the like, so that a block erase operation is performed with respect to the entirety of the memory cell array 16 at once, or is performed on a block-specific basis. The word-line potential is supplied to the word lines of the memory cell array 16 via the word-line bias circuit 14A, and is also supplied to the word line of the reference cell 20 via the reference-word-line bias circuit 21.

Figure 6:
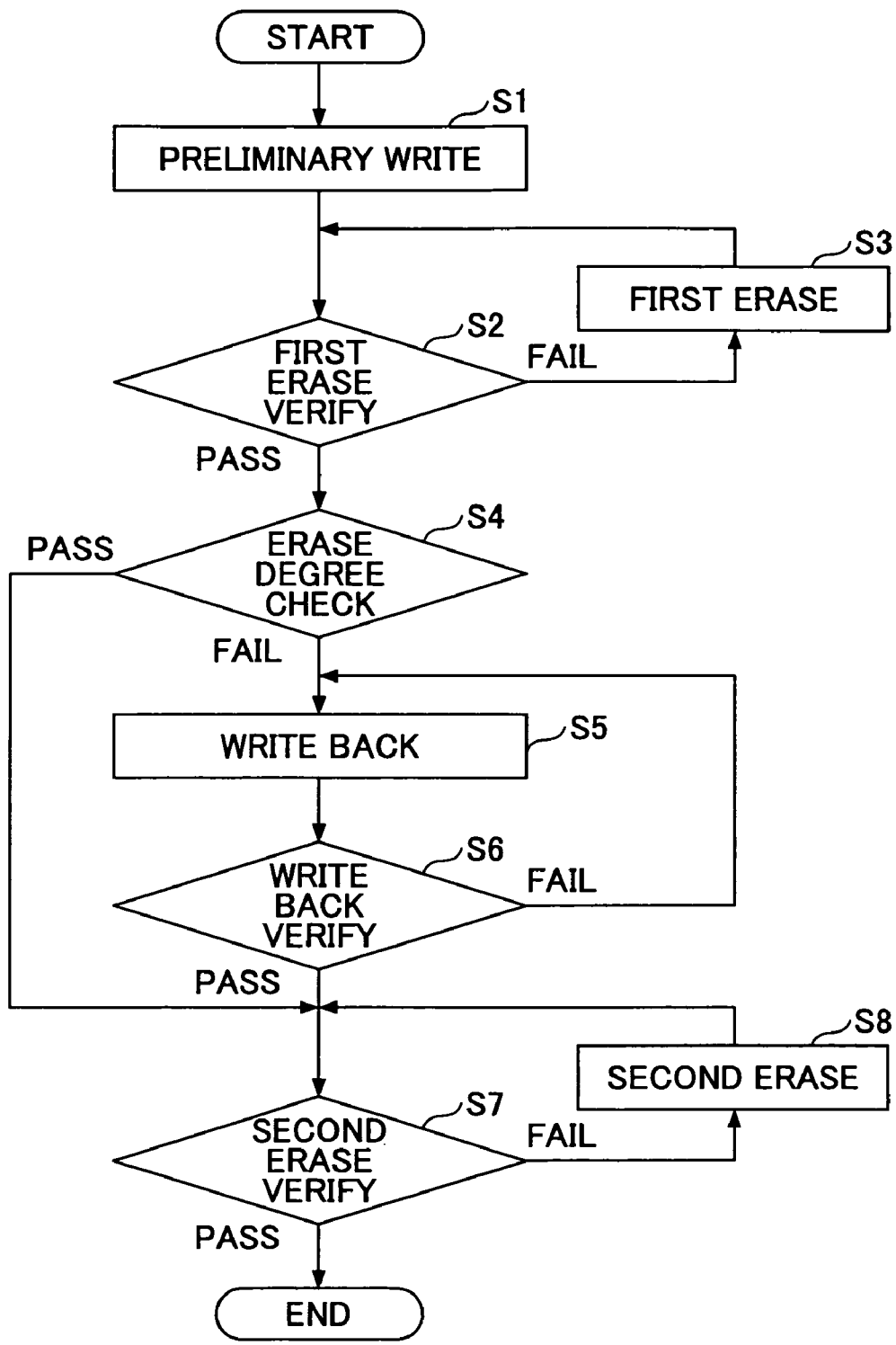
FIG. 6 is a flowchart showing a first embodiment of an erase operation according to the present invention.

FIG. 6 is a flowchart showing a first embodiment of the erase operation according to the present invention. FIG. 7 through FIG. 10 are drawings for explaining the first embodiment of the erase operation according to the present invention. In FIG. 7 through FIG. 10, the horizontal axis represents the threshold voltage of memory cells of the memory cell array, and the vertical axis represents the number of memory cells present in the memory cell array that have a given threshold voltage. Although an erase operation is performed with respect to the entirety of the memory cell array or with respect to a specified block to be erased, the following description will be given by invariably referring to an erasure target as a memory cell array for the sake of convenience.

Figure 2:
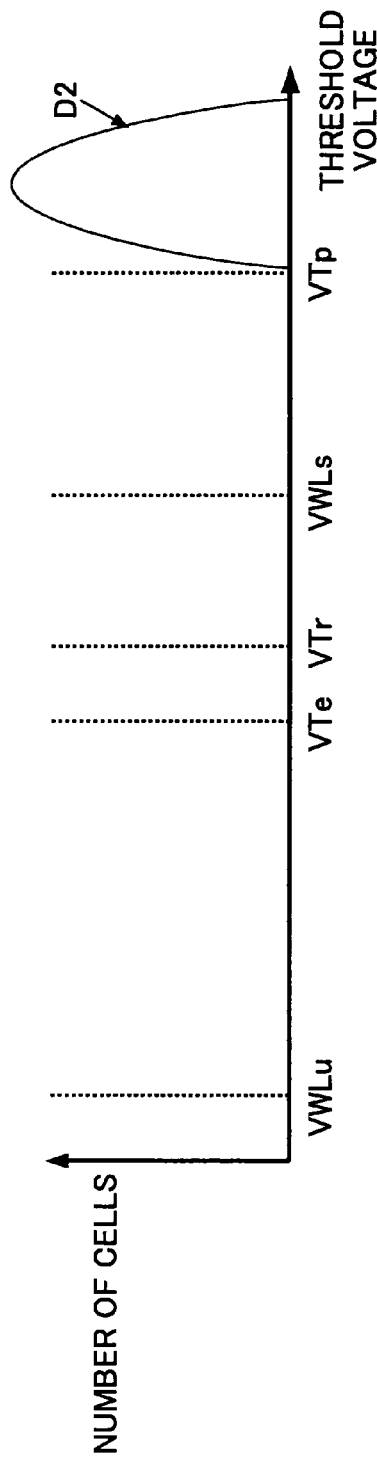
FIG. 2 is another drawing for explaining the memory erase operation in a conventional flash memory.
Figure 3:
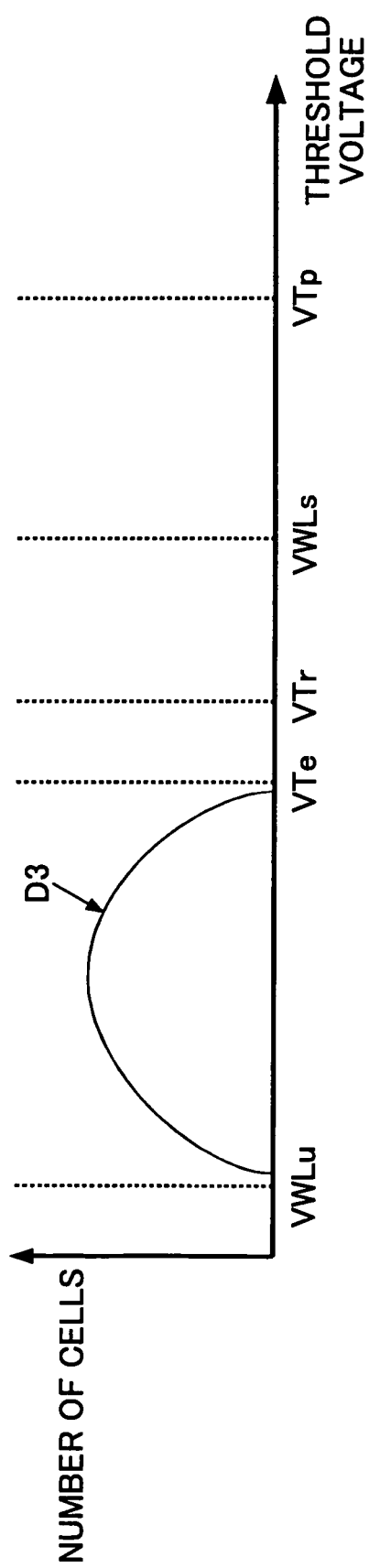
FIG. 3 is another drawing for explaining the memory erase operation in a conventional flash memory.

At step S1 of FIG. 6, a preliminary write operation is performed. This is the same as the preliminary write operation that was described in connection with FIG. 1 and FIG. 2. A write verify that compares the current running through a reference cell having threshold voltage VTp with the read current of each cell of the memory cell array is performed. A write operation with respect to each memory cell is performed until each memory cell of the memory cell array is placed in the written state by passing the write verify. After the "preliminary write", as shown as a distribution D7 in FIG. 7, the threshold voltages of all the memory cells are set higher than VTp, which corresponds to the logic "0" state.

Figure 7:
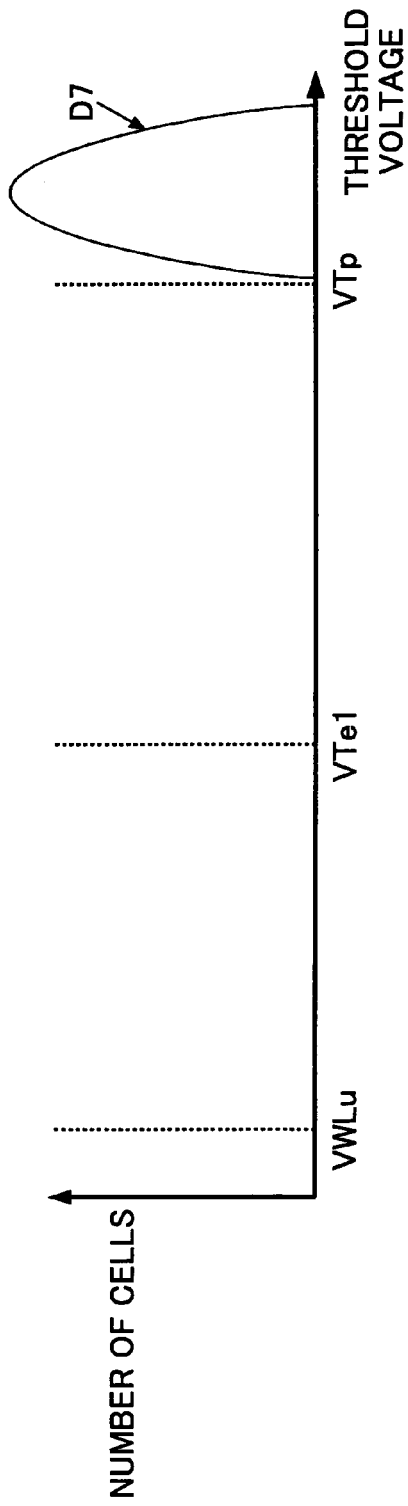
FIG. 7 is a drawing for explaining the first embodiment of the erase operation according to the present invention.

After this, at step S2, a first erase verify is performed. Namely, an erase verify that compares the current running through a reference cell having threshold voltage VTe1 as shown in FIG. 7 with the read current of each cell of the memory cell array is performed. If there is a memory cell that is not in the erased state, a first block erase is performed at step S3 with respect to the memory cell array.

Steps S2 and S3 are repeated as many times as necessary, so that a block erase operation with respect to the memory cell array is performed until each memory cell of the memory cell array is placed in the erased state by passing the erase verify using the erase verify reference voltage VTe1. As a result, as shown as a distribution D8 in FIG. 8, the threshold voltages of all the memory cells are set lower than VTe1.

Figure 8:
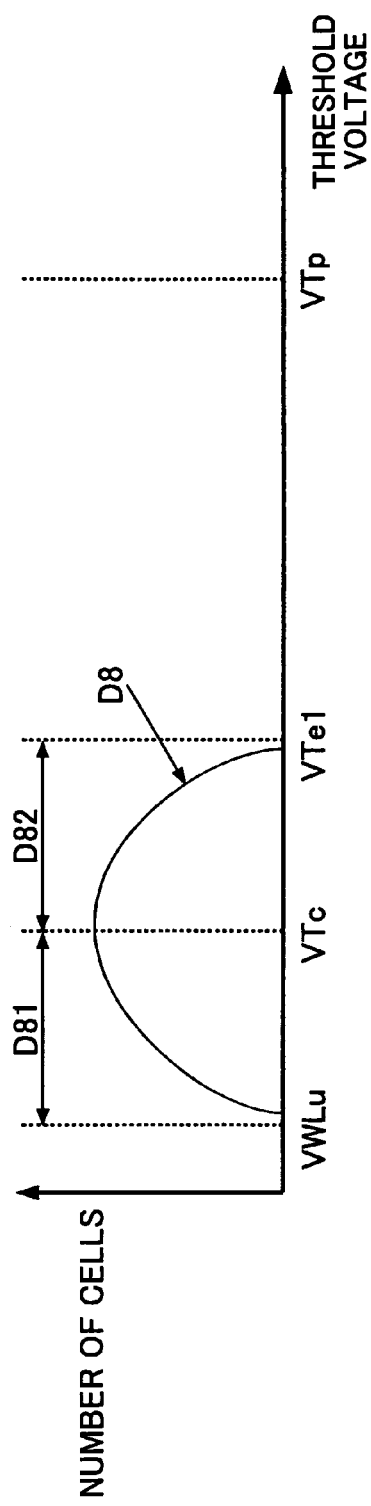
FIG. 8 is a drawing for explaining the first embodiment of the erase operation according to the present invention.

At step S4, an erase-degree check is performed. Namely, the current running through a reference cell having threshold voltage VTc as shown in FIG. 8 is compared with the read current of each cell of the memory cell array, thereby checking the relative size of the threshold voltage of each memory cell in comparison with VTc. If the threshold voltage of a memory cell is greater than VTc (i.e., if this memory cell belongs to a threshold distribution D82), the result of the erase-degree check indicates a pass. If the result indicates a pass, the procedure proceeds to step S7.

If the threshold voltage of a memory cell is lower than VTc, the result of the erase-degree check indicates a fail. In this case, a write-back operation and a write-back verify are performed at step S5 and step S6, respectively. Namely, a write operation using threshold voltage VTm as a write-back-verify reference voltage is performed with respect to the memory cells that have failed in the erase-degree check (i.e., the memory cells belonging to a threshold distribution D81). Specifically, a write-back verify that compares the current running through a reference cell having the threshold voltage VTm with the read current of each cell having failed in the erase-degree check is performed. A write operation with respect to each memory cell is performed until each memory cell is placed in the written-back state by passing the write-back verify. After the write-back operation, as shown as a distribution D9 in FIG. 9, the threshold voltages of all the memory cells having failed in the erase-degree check are set higher than VTm.

After this, at step S7, a second erase verify is performed. Namely, an erase verify that compares the current running through a reference cell having threshold voltage VTe2 (<VTe1) as shown in FIG. 10 with the read current of each cell of the memory cell array is performed. If there is a memory cell that is not in the erased state, a second block erase is performed at step S8 with respect to the memory cell array.

Steps S7 and S8 are repeated as many times as necessary, so that a block erase operation with respect to the memory cell array is performed until each memory cell of the memory cell array is placed in the erased state by passing the erase verify using the erase verify reference voltage VTe2. As a result, as shown as a distribution D10 in FIG. 10, the threshold voltages of all the memory cells are set lower than VTe2, which corresponds to logic "1".

If the second erase operation is performed without performing the write-back operation in the condition shown in FIG. 8, the width of the threshold distribution D8 stays as it is, and the position of the threshold distribution will be shifted to a lower voltage (i.e., to the left in the drawing). This is a straightforward case. In this case, the threshold voltages of memory cells situated at the left end of the threshold distribution D8 shown in FIG. 8 will end up being lower than the unselected-word-line voltage VWLu, likely to end up being over-erased.

The reality may be more complicated. The memory cells situated on the right-hand side of the center of the threshold distribution D8 shown in FIG. 8 have such characteristics that they are difficult to erase, and the memory cells situated on the left-hand side of the center have such characteristics that they are easy to erase. In reality, therefore, performing the second erase operation without performing the write-back operation will result in the threshold distribution being widened while shifting its position to a lower voltage. In this case, the possibility that the memory cells positioned at the left end of the threshold distribution D8 shown in FIG. 8 will be over-erased is quite high.

In the first embodiment of the erase operation according to the present invention, as shown in the flowchart of FIG. 6, the first erase operation is performed, and, then, a preparatory operation inclusive of the erase-degree check and the write-back operation is performed, followed by the second erase operation. Through the preparatory operation inclusive of the erase-degree check and the write-back operation, the memory cells belonging to the threshold distribution D81 on the left-hand side of the center of the threshold distribution D8 shown in FIG. 8 are identified as being comparatively easy to erase, and are then given threshold voltages generally higher than those of the memory cells belonging to the threshold distribution D82 on the right-hand side of the center of the threshold distribution D8 shown in FIG. 8. This can narrow the threshold voltage distribution that appears after the second erase operation. Namely, the threshold voltages of all the memory cells can be lowered below the erase verify reference voltage VTe2 of the second erase operation lower than the erase verify reference voltage VTe1 of the first erase operation, while the position of the left-hand-side end of the threshold voltage distribution after the second erase operation is shifted to the right. Such shift is achieved by raising, prior to the second erase operation, the threshold voltages of the memory cells that are lower than the predetermined threshold voltage VTc in the threshold distribution after the first erase operation.

Figure 11:
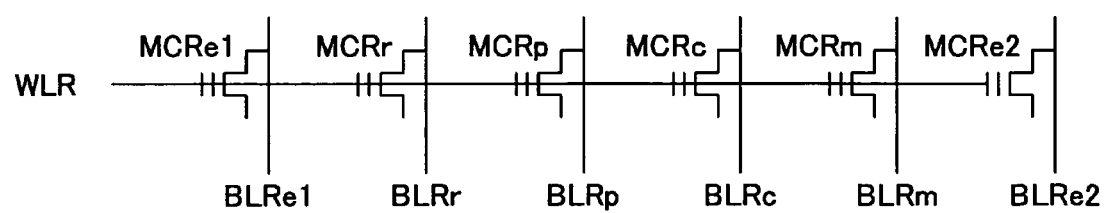
FIG. 11 is a drawing showing an example of the configuration of a reference cell used in the nonvolatile semiconductor memory device that performs the first embodiment of the erase operation according to the present invention.
Figure 12:
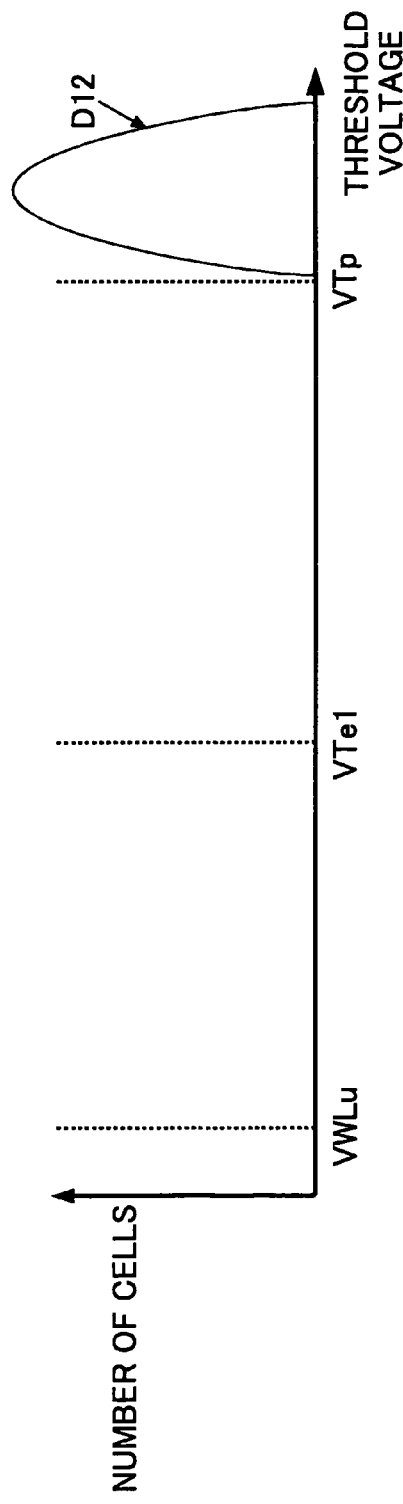
FIG. 12 is a drawing for explaining a second embodiment of the erase operation according to the present invention.

FIG. 11 is a drawing showing an example of the configuration of the reference cell 20 used in the nonvolatile semiconductor memory device that performs the first embodiment of the erase operation according to the present invention. The reference cell 20 shown in FIG. 11 includes an erase-verify-purpose reference cell MCRe1 for the first erase operation, a read-check-purpose reference cell MCRr, a write-verify-purpose reference cell MCRp, an erase-degree-check-purpose reference cell MCRc, a write-back-verify-purpose reference cell MCRm, and an erase-verify-purpose reference cell MCRe2 for the second erase operation.

The erase-verify-purpose reference cell MCRe1 for the first erase operation has the threshold voltage VTe1. The read-check-purpose reference cell MCRr has the threshold voltage VTr. The write-verify-purpose reference cell MCRp has the threshold voltage VTp. The erase-degree-check-purpose reference cell MCRc has the threshold voltage VTc. The write-back-verify-purpose reference cell MCRm has the threshold voltae VTm . The erase-verify-purpose reference cell MCRe2 for the second erase operation has the threshold voltage VTe2. These threshold voltages are illustrated in FIG. 7 through FIG. 10. A characteristic feature may be that the threshold voltage VTm is higher than the threshold voltage VTc, and that the threshold voltage VTe1 is higher than the threshold voltage VTe2.

The reference cells MCRe1, MCRr, MCRp, MCRc, MCRm, and MCRe2 are connected to reference bit lines BLRe1, BLRr, BLRp, BLRc, BLRm, and BLRe2, respectively. These reference bit lines are coupled to the sense amplifier 17 via the reference select 22 shown in FIG. 4.

FIG. 12 through FIG. 15 are drawings for explaining a second embodiment of the erase operation according to the present invention. First, a preliminary write operation is performed in the same manner as in the first embodiment of the erase operation. As a result of the preliminary write operation, as shown as a distribution D12 in FIG. 12, the threshold voltages of all the memory cells are set higher than VTp, which corresponds to the logic "0" state.

Next, a first erase verify and a first block erase are performed in the same manner as in the first embodiment of the erase operation. As a result, as shown as a distribution D13 in FIG. 13, the threshold voltages of all the memory cells are set lower than VTe1.

Figure 13:
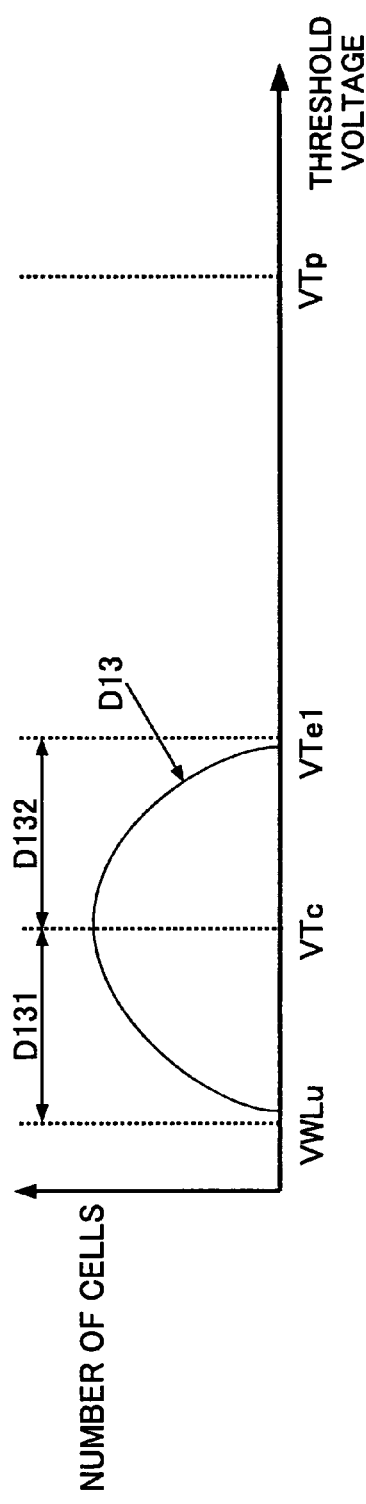
FIG. 13 is a drawing for explaining the second embodiment of the erase operation according to the present invention.

Then, an erase-degree check is performed. Namely, the current running through a reference cell having threshold voltage VTc as shown in FIG. 13 is compared with the read current of each cell of the memory cell array, thereby checking the relative size of the threshold voltage of each memory cell in comparison with VTc. If the threshold voltage of a memory cell is greater than VTc (i.e., if this memory cell belongs to a threshold distribution D132), the result of the erase-degree check indicates a pass.

If the threshold voltage of a memory cell is lower than VTc, the result of the erase-degree check indicates a fail. In this case, a write-back operation and a write-back verify are performed. Namely, a write operation using the threshold voltage VTm as a write-back-verify reference voltage is performed with respect to the memory cells that have failed in the erase-degree check (i.e., the memory cells belonging to a threshold distribution D131). As a result of the write-back operation, as shown as a distribution D14 in FIG. 14, the threshold voltages of all the memory cells having failed in the erase-degree check are set higher than VTm .

After this, a second erase verify and a second block erase operation are performed in the same manner as in the first embodiment of the erase operation. As a result, as shown as a distribution D15 in FIG. 15, the threshold voltages of all the memory cells are set lower than VTe2 (<VTe1), which corresponds to logic "1".

In the first embodiment of the erase operation previously described, the write-back-verify reference voltage VTm is set lower than the erase verify reference voltage VTe1 of the first erase operation. In the second embodiment of the erase operation, on the other hand, the write-back-verify reference voltage VTm is set higher than the erase verify reference voltage VTe1 of the first erase operation as shown in FIG. 14. The second embodiment may be characterized in that the threshold voltage VTe1 is higher than the threshold voltage VTc, that the threshold voltage VTm is higher than the threshold voltage VTe1, and that the threshold voltage VTe1 is higher than the threshold voltage VTe2. The memory cells belonging to the threshold distribution D131 on the left-hand side of the center of the threshold distribution D13 shown in FIG. 13 are easier to erase, and are thus given higher threshold voltages, than any of the memory cells belonging to the threshold distribution D132 on the right-hand side of the center of the threshold distribution D13 shown in FIG. 13, thereby narrowing the threshold voltage distribution that appears after the second erase operation.

With the provision that set the write-back-verify reference voltage VTm as described above, it may be possible to make the threshold voltage distribution narrower than that of the first embodiment of the erase operation. By setting the write-back-verify reference voltage VTm higher, however, an opposite effect may appear. Namely, a block erase operation may be performed many times in order to shift the memory cells belonging to the threshold voltage distribution D14 shown in FIG. 14 so as to position them below the threshold voltage VTe2 shown in FIG. 15. In such a case, it is possible that the memory cells belonging to the threshold voltage distribution D132 shown in FIG. 14 are over-erased. It is thus preferable to select the write-back-verify reference voltage VTm carefully such as to attain an optimum result.

Figure 16:
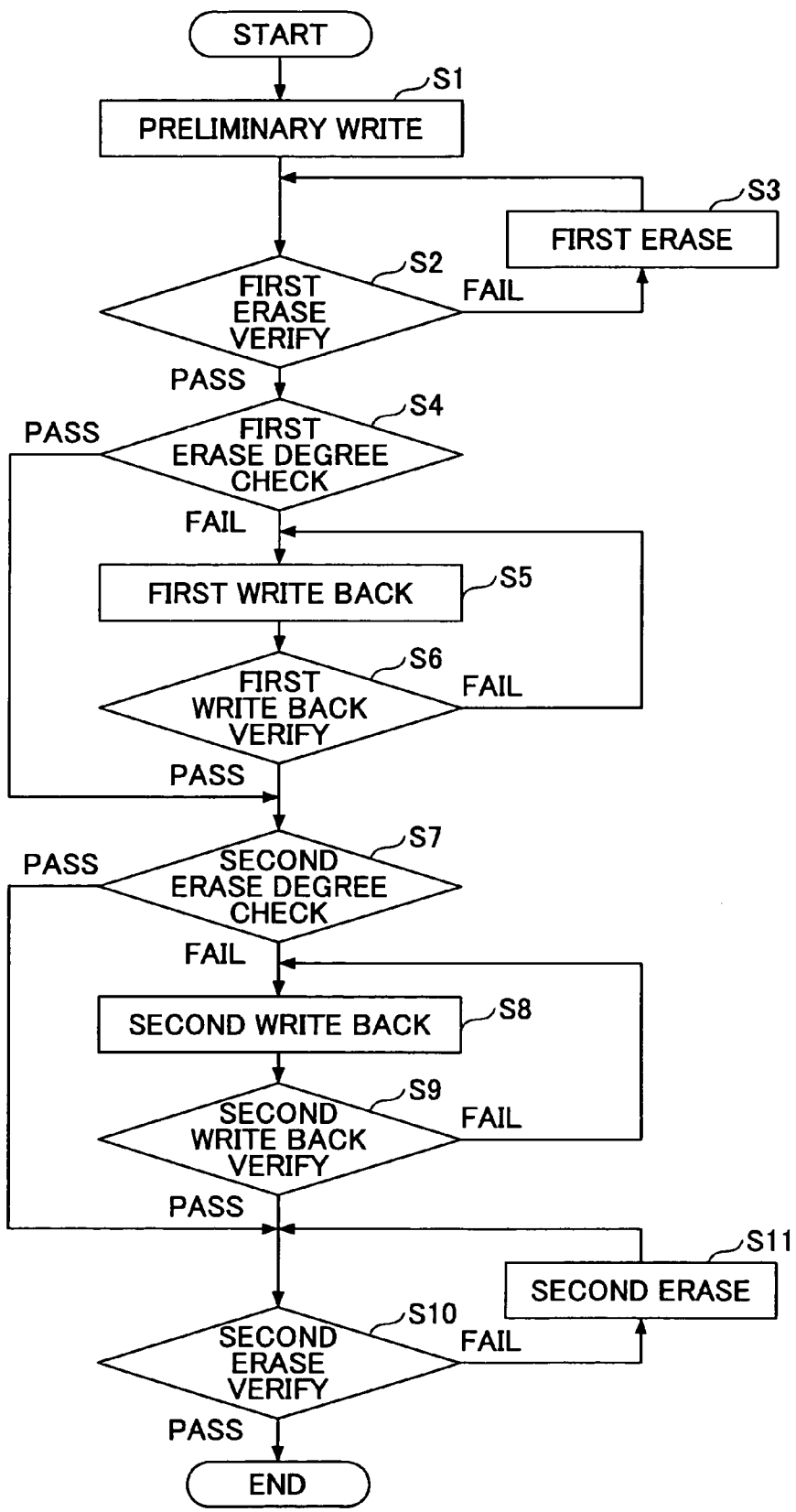
FIG. 16 is a flowchart showing a third embodiment of the erase operation according to the present invention.

FIG. 16 is a flowchart showing a third embodiment of the erase operation according to the present invention. FIG. 17 through FIG. 21 are drawings for explaining the third embodiment of the erase operation according to the present invention.

At step S1 of FIG. 16, a preliminary write operation is performed. This preliminary write operation is the same as the preliminary write operation of the first embodiment of the erase operation. As a result of the preliminary write operation, as shown as a distribution D17 in FIG. 17, the threshold voltages of all the memory cells are set higher than VTp, which corresponds to the logic "0" state.

After this, at step S2 and step S3, a first erase verify and a first block erase are performed in the same manner as in the first embodiment of the erase operation. As a result, as shown as a distribution D18 in FIG. 18, the threshold voltages of all the memory cells are set lower than VTe1.

At step S4, a first erase-degree check is performed. Namely, the current running through a reference cell having threshold voltage VTc1 as shown in FIG. 18 is compared with the read current of each cell of the memory cell array, thereby checking the relative size of the threshold voltage of each memory cell in comparison with VTc1. If the threshold voltage of a memory cell is greater than VTc1 (i.e., if this memory cell belongs to a threshold distribution D182), the result of the erase-degree check indicates a pass. In the case of a pass, the procedure proceeds to step S7.

If the threshold voltage of a memory cell is lower than VTc1, the result of the erase-degree check indicates a fail. In this case, a first write-back operation and a first write-back verify are performed at step S5 and step S6, respectively. Namely, a write operation using threshold voltage VTm1 as a write-back-verify reference voltage is performed with respect to the memory cells that have failed in the first erase-degree check (i.e., the memory cells belonging to a threshold distribution D181). Specifically, a write-back verify that compares the current running through a reference cell having the threshold voltage VTm1 with the read current of each cell having failed in the erase-degree check is performed. A write operation with respect to each memory cell is performed until each memory cell is placed in the written-back state by passing the write-back verify. After the write-back operation, as shown as a distribution D19 in FIG. 19, the threshold voltages of all the memory cells having failed in the first erase-degree check are set higher than VTm1.

After this, at step S7, a second erase-degree check is performed. Namely, the current running through a reference cell having threshold voltage VTc2 (>VTc1) as shown in FIG. 19 is compared with the read current of each cell of the memory cell array, thereby checking the relative size of the threshold voltage of each memory cell in comparison with VTc2. If the threshold voltage of a memory cell is greater than VTc2 (i.e., if this memory cell belongs to a threshold distribution D192), the result of the erase-degree check indicates a pass. In the case of a pass, the procedure proceeds to step S10.

If the threshold voltage of a memory cell is lower than VTc2, the result of the erase-degree check indicates a fail. In this case, a second write-back operation and a second write-back verify are performed at step S8 and step S9, respectively. Namely, a write operation using threshold voltage VTm2 (<VTm1) as a write-back-verify reference voltage is performed with respect to the memory cells that have failed in the second erase-degree check (i.e., the memory cells belonging to a threshold distribution D191). Specifically, a write-back verify that compares the current running through a reference cell having the threshold voltage VTm2 with the read current of each cell having failed in the erase-degree check is performed. A write operation with respect to each memory cell is performed until each memory cell is placed in the written-back state by passing the write-back verify. After the write-back operation, as shown as a distribution D20 in FIG. 20, the threshold voltages of all the memory cells having failed in the second erase-degree check are set higher than VTm2.

Figure 21:
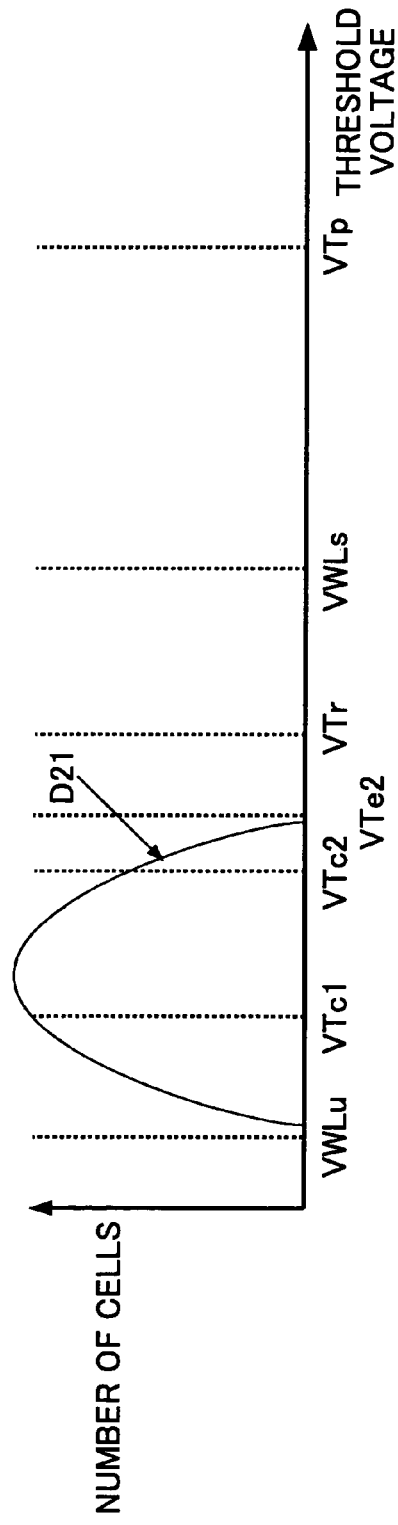
FIG. 21 is a drawing for explaining the third embodiment of the erase operation according to the present invention.

At step S10, a second erase verify is performed. Namely, an erase verify that compares the current running through a reference cell having threshold voltage VTe2 (<VTe1) as shown in FIG. 21 with the read current of each cell of the memory cell array is performed. If there is a memory cell that is not in the erased state, a second block erase is performed at step S11 with respect to the memory cell array.

Steps S10 and S11 are repeated as many times as necessary, so that a block erase operation with respect to the memory cell array is performed until each memory cell of the memory cell array is placed in the erased state by passing the erase verify using the erase verify reference voltage VTe2. As a result, as shown as a distribution D21 in FIG. 21, the threshold voltages of all the memory cells are set lower than VTe2, which corresponds to logic "1".

In the third embodiment of the erase operation according to the present invention, as shown in the flowchart of FIG. 16, the first erase operation is performed, and, then, the write-back operation is performed, followed by the second erase operation. In this write-back operation, the memory cells are grouped into three groups according to their threshold voltages, and the groups that need write-back operation have the threshold voltages thereof raised to respective write-back voltages that differ from group to group. The lower, the threshold voltage (the easier the memory cell to erase), the higher the threshold voltage after the write-back operation is. Namely, the threshold distributions are related as D181<D191<D192 in FIG. 18 and FIG. 19, and are pre-processed such that the threshold distributions are related as D19>D20>D192 in FIG. 20 after the write-back operation based on the erase-degree check. With this provision, it is possible to perform more diligent control of threshold voltages, thereby further narrowing the threshold voltage distribution compared with that of the first embodiment.

In the third embodiment of the erase operation, the memory cells are grouped into three groups according to their threshold voltages. The number of groups is not limited 3, and may properly be 4 or more according to need.

Figure 22:
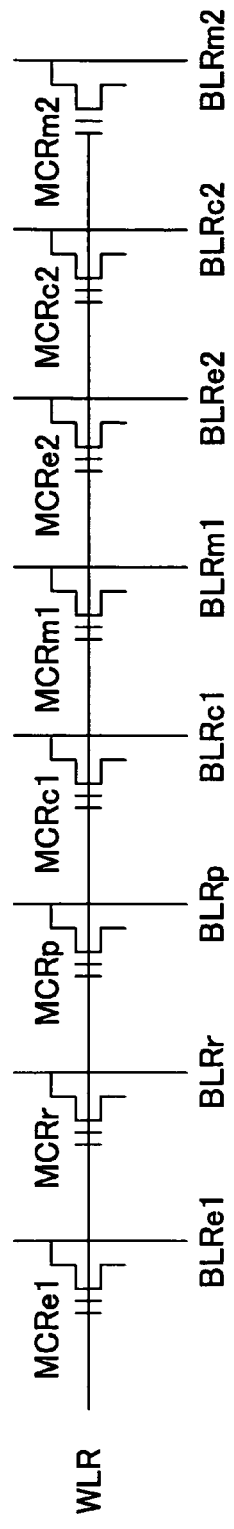
FIG. 22 is a drawing showing an example of the configuration of a reference cell used in the nonvolatile semiconductor memory device that performs the third embodiment of the erase operation according to the present invention.

FIG. 22 is a drawing showing an example of the configuration of the reference cell 20 used in the nonvolatile semiconductor memory device that performs the third embodiment of the erase operation according to the present invention. The reference cell 20 shown in FIG. 22 includes an erase-verify-purpose reference cell MCRe1 for the first erase operation, a read-check-purpose reference cell MCRr, a write-verify-purpose reference cell MCRp, a first erase-degree-check-purpose reference cell MCRc1, a first write-back-verify-purpose reference cell MCRm1, an erase-verify-purpose reference cell MCRe2 for the second erase operation, a second erase-degree-check-purpose reference cell MCRc2, and a second write-back-verify-purpose reference cell MCRm2.

The erase-verify-purpose reference cell MCRe1 for the first erase operation has the threshold voltage VTe1. The read-check-purpose reference cell MCRr has the threshold voltage VTr. The write-verify-purpose reference cell MCRp has the threshold voltage VTp. The first erase-degree-check-purpose reference cell MCRc1 has the threshold voltage VTc1. The first write-back-verify-purpose reference cell MCRm1 has the threshold voltae VTm1. The erase-verify-purpose reference cell MCRe2 for the second erase operation has the threshold voltage VTe2. The second erase-degree-check-purpose reference cell MCRc2 has the threshold voltage VTc2. The second write-back-verify-purpose reference cell MCRm2 has the threshold voltae VTm2. These threshold voltages are illustrated in FIG. 17 through FIG. 21. The third embodiment may be characterized in that the threshold voltage VTc2 is higher than the threshold voltage VTc1, that the threshold voltage VTm2 is higher than the threshold voltage VTc2, that the threshold voltage VTm1 is higher than the threshold voltage VTm2, and that the threshold voltage VTe1 is higher than the threshold voltage VTe2.

The reference cells MCRe1, MCRr, MCRp, MCRc1, MCRm1, MCRe2, MCRc2, and MCRm2 are connected to reference bit lines BLRe1, BLRr, BLRp, BLRc1, BLRm1, BLRe2, BLRc2, and BLRm2, respectively. These reference bit lines are coupled to the sense amplifier 17 via the reference select 22 shown in FIG. 4.

Further, the present invention is not limited to these embodiments, but various variations and modifications may be made without departing from the scope of the present invention.

What is claimed is:

1. A nonvolatile semiconductor memory device, comprising:
 a plurality of nonvolatile memory cells constituting an entirety or part of a memory cell array; and
 a control circuit configured to perform a first block erase operation that erases the plurality of nonvolatile memory cells together in a lump such that threshold voltages of the memory cells are set lower than a first erase verify voltage, to perform a first erase-degree check as to whether a threshold voltage of each of the nonvolatile memory cells is lower than a first erase-degree-check voltage after the first block erase operation, to perform a first write-back operation in response to a check result indicating that the threshold voltage is lower than the first erase-degree-check voltage, the first write-back operation raising the threshold voltage above a first write-back-verify voltage that is higher than the first erase-degree-check voltage, and to perform a second block erase operation that erases the plurality of nonvolatile memory cells together in a lump after the first write-back operation such that the threshold voltages of the memory cells are set lower than a second erase verify voltage.

2. The nonvolatile semiconductor memory device as claimed in claim 1, further comprising:
 a first-erase-operation-purpose reference cell for comparison with the nonvolatile memory cells in a first erase verify operation accompanying the first block erase operation;
 a first-erase-degree-check-purpose reference cell for comparison with the nonvolatile memory cells in the first erase-degree check; and
 a second-erase-operation-purpose reference cell for comparison with the nonvolatile memory cells in a second erase verify operation accompanying the second block erase operation,
 wherein the second-erase-operation-purpose reference cell has a threshold voltage lower than that of the first-erase-operation-purpose reference cell.

3. The nonvolatile semiconductor memory device as claimed in claim 2, further comprising a first-write-back-verify-purpose reference cell for comparison with the nonvolatile memory cells in a first write-back verify operation accompanying the first write-back operation, wherein the first-write-back-verify-purpose reference cell has a threshold voltage higher than that of the first-erase-operation-purpose reference cell.

4. The nonvolatile semiconductor memory device as claimed in claim 1, wherein the control circuit is configured to perform a preliminary write operation to write memory cells that are in an erased state among the plurality of nonvolatile memory cells before the first block erase operation.

5. The nonvolatile semiconductor memory device as claimed in claim 4, further comprising:
 a write-verify-purpose reference cell for comparison with the nonvolatile memory cells in a write-verify operation accompanying the preliminary write operation; and
 a first-write-back-verify-purpose reference cell for comparison with the nonvolatile memory cells in a first write-back verify operation accompanying the first write-back operation,
 wherein the first-write-back-verify-purpose reference cell has a threshold voltage lower than that of the write-verify-purpose reference cell.

6. The nonvolatile semiconductor memory device as claimed in claim 1, wherein a preparatory operation inclusive of the first erase-degree check and the first write-back operation is performed more than once, said nonvolatile semiconductor memory device further including a plurality of erase-degree-check-purpose reference cells and a plurality of write-back-verify-purpose reference cells for comparison with the nonvolatile memory cells in a plurality of erase-degree checks and a plurality of write-back operations included in the plurality of preparatory operations, the plurality of erase-degree-check-purpose reference cells having respective different threshold voltages, and the plurality of write-back-verify-purpose reference cells having respective different threshold voltages.

7. A nonvolatile semiconductor memory device, comprising:
 a plurality of nonvolatile memory cells constituting an entirety or part of a memory cell array; and
 a control circuit configured to perform a first block erase operation that erases the plurality of nonvolatile memory cells together in a lump such that threshold voltages of the memory cells are set lower than a first erase verify voltage, to perform a first erase-degree check as to whether a threshold voltage of each of the nonvolatile memory cells is lower than a first erase-degree-check voltage after the first block erase operation, to perform a first write-back operation in response to a check result indicating that the threshold voltage is lower than the first erase-degree-check voltage, the first write-back operation raising the threshold voltage above a first write-back-verify voltage, to perform a second erase-degree check as to whether a threshold voltage of each of the nonvolatile memory cells is lower than a second erase-degree-check voltage after the first write-back operation, to perform a second write-back operation in response to a check result indicating that the threshold voltage is lower than the second erase-degree-check voltage, the second write-back operation raising the threshold voltage above a second write-back-verify voltage, and to perform a second block erase operation that erases the plurality of nonvolatile memory cells together in a lump after the second write-back operation such that the threshold voltages of the memory cells are set lower than a second erase verify voltage, wherein the second erase-degree-check voltage is higher than the first erase-degree-check voltage, the second write-back-verify voltage being higher than the second erase-degree-check voltage, and the first write-back-verify voltage being higher than the second write-back-verify voltage.

8. A method of erasing nonvolatile memory cells in a nonvolatile semiconductor memory device in which a plurality of nonvolatile memory cells constituting an entirety or part of a memory cell array are erased together in a lump, comprising:

a first block erase step of erasing the plurality of nonvolatile memory cells together in a lump;

a check step of checking whether a threshold voltage of each of the nonvolatile memory cells is lower than a predetermined voltage after the first block erase step;

a write-back step of raising the threshold voltage above the predetermined voltage of the check step with respect to the nonvolatile memory cells having the threshold voltages lower than the predetermined voltage in accordance with a check result of the check step; and a second block erase step of erasing the plurality of nonvolatile memory cells together in a lump after the write-back step.

9. The method as claimed in claim 8, wherein the first block erase step includes a first erase verify step of ensuring that the threshold voltages of all the nonvolatile memory cells are lower than a first threshold voltage, and the second block erase step includes a second erase verify step of ensuring that the threshold voltages of all the nonvolatile memory cells are lower than a second threshold voltage, the second threshold voltage being lower than the first threshold voltage.

10. The method as claimed in claim 8, further comprising a preliminary write step of writing memory cells that are in an erased state among the plurality of nonvolatile memory cells before the first block erase step, wherein a write verify reference voltage used in a write-verify operation accompanying the preliminary write step being different from a write verify reference voltage used in a write-back-verify operation accompanying the write back step.

* * * * *